United States Patent
Jones et al.

(10) Patent No.: US 7,440,734 B1
(45) Date of Patent: Oct. 21, 2008

(54) ACTIVE QUADRATURE RADIO FREQUENCY POWER DETECTOR

(75) Inventors: David E. Jones, Cedar Rapids, IA (US); Andrew F. Folkmann, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 462 days.

(21) Appl. No.: 11/348,104

(22) Filed: Feb. 6, 2006

(51) Int. Cl.
*H03C 1/62* (2006.01)
*H04B 17/00* (2006.01)

(52) U.S. Cl. .................... 455/115.1; 327/61

(58) Field of Classification Search ............. 455/115.1, 455/115.4, 118; 324/76.11; 327/50, 51, 327/58, 61
See application file for complete search history.

(56) References Cited

U.S. PATENT DOCUMENTS

| | | | |
|---|---|---|---|
| 6,108,527 A | * | 8/2000 | Urban et al. ............. 455/115.3 |
| 6,265,943 B1 | | 7/2001 | Dening et al. |
| 6,307,364 B1 | | 10/2001 | Augustine |
| 6,329,809 B1 | | 12/2001 | Dening et al. |
| 6,528,983 B1 | | 3/2003 | Augustine |
| 6,720,831 B2 | | 4/2004 | Dening et al. |
| 6,927,630 B2 | * | 8/2005 | Dupuis et al. ............. 330/254 |
| 2004/0235437 A1 | * | 11/2004 | Gels et al. ............. 455/127.1 |

* cited by examiner

*Primary Examiner*—Nguyen Vo
(74) *Attorney, Agent, or Firm*—Withrow & Terranova, PLLC

(57) ABSTRACT

The present invention is a quadrature RF power detector circuit, which is used in conjunction with a quadrature RF power amplifier to detect and combine RF signals from an in-phase amplifier leg and from a quadrature-phase amplifier leg to provide an RF power detection signal. The quadrature RF power detector circuit includes an emitter follower amplifier for each leg of the quadrature RF power amplifier and may include doubler circuitry to detect both half-cycles of an RF signal. The emitter follower detector provides power detection with minimal DC current and without significant RF loading at the point of detection, such as an RF interstage. This balanced detector also provides more accurate power detection under high VSWR conditions due to the quadrature action minimizing peaks and valleys in the detected voltage.

20 Claims, 6 Drawing Sheets

ACTIVE QUADRATURE RADIO FREQUENCY POWER DETECTOR

FIELD OF THE INVENTION

The present invention relates to Radio Frequency (RF) power detectors used in RF communications circuitry.

BACKGROUND OF THE INVENTION

RF power detectors are commonly used to measure output power in RF communications systems, which need to control output power of RF power amplifiers. The output power is controlled to stay within regulatory power limits, to minimize power consumption in battery powered devices, such as mobile terminals, mobile phones, and Personal Digital Assistants (PDAs), and to transmit only enough power for effective communications, thus minimizing interference with other RF devices.

Gain, DC current, and adjacent channel power (ACP) of an RF power amplifier are functions of the load impedance seen at the output of the power amplifier. Ideally, the load impedance is a constant load; however, in reality, the load impedance may change due to variations in the impedance of the components in the transmit chain following the power amplifier, such as a duplexer, caused by frequency, temperature, and process variations. Load impedance may also vary due to variations in impedance of an antenna of a mobile device caused by proximity of the antenna to foreign metallic objects and a user's body. As a result, RF power amplifier architectures that tend to minimize gain, DC current, and ACP variations due to changes in load impedance are commonly used. Once such architecture is a quadrature RF power amplifier.

The stability of a quadrature RF power amplifier's performance is not as susceptible to output load variations as other RF power amplifier architectures. A quadrature RF power amplifier splits and phase shifts an RF input signal into two quadrature RF signals that are 90 degrees out of phase with each other. The two quadrature RF signals are then amplified, phase shifted back into phase with each other, and then combined to form an RF output signal. The quadrature power amplifier minimizes performance variations by presenting each side of the amplifier with a load that is 180 degrees out of phase with the other side of the amplifier. When one side of the amplifier is presented with a load that causes low gain, the other side is being presented with a load that causes high gain on that side. This is in contrast to a single ended amplifier in which the amplifier stage is presented with a single load. Hence, the quadrature architecture provides a method of diversifying the load presented to the power amplifier. This diversification results in higher immunity to performance variation resulting from a high voltage standing wave ratio (VSWR) at the power amplifier's output.

Traditional approaches for detecting output power use a directional coupler at the output of the RF power amplifier to provide a signal representative of the output of the power amplifier. A power detector then processes the signal to detect the output power of the power amplifier; however, the directional coupler uses some of the output power, which adds loss to the transmit path, thereby decreasing the efficiency of the RF communications system. Thus, there remains a need for a system for detecting the output power of an RF power amplifier that is tolerant to variations in load impedance and eliminates the need for a directional coupler.

SUMMARY OF THE INVENTION

The present invention is a quadrature RF power detector circuit, which is used in conjunction with a quadrature RF power amplifier to detect and combine RF signals from an in-phase amplifier leg and from a quadrature-phase amplifier leg to provide an RF power detection signal. The quadrature RF power detector circuit includes an emitter follower amplifier for each leg of the quadrature RF power amplifier and may include doubler circuitry to detect both half-cycles of an RF signal. The emitter follower detector provides power detection with minimal DC current and without significant RF loading at the point of detection, such as an RF interstage. This balanced detector also provides more accurate power detection under high VSWR conditions due to the quadrature action minimizing peaks and valleys in the detected voltage.

Since the quadrature RF power detector circuit uses active circuitry, no RF power coupler is needed. The input impedance of the quadrature RF power detector circuit is high enough for use at any quadrature RF power amplifier stage. Detection of output power from a quadrature amplifier stage is less susceptible to output load variations than detection of output power after quadrature amplifier signals have been phase-shifted and combined into an RF power amplifier output signal. The emitter follow amplifier architecture of the quadrature RF power detector circuit provides a low output impedance, which supports fast response time applications and can drive low impedance loads.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 4:
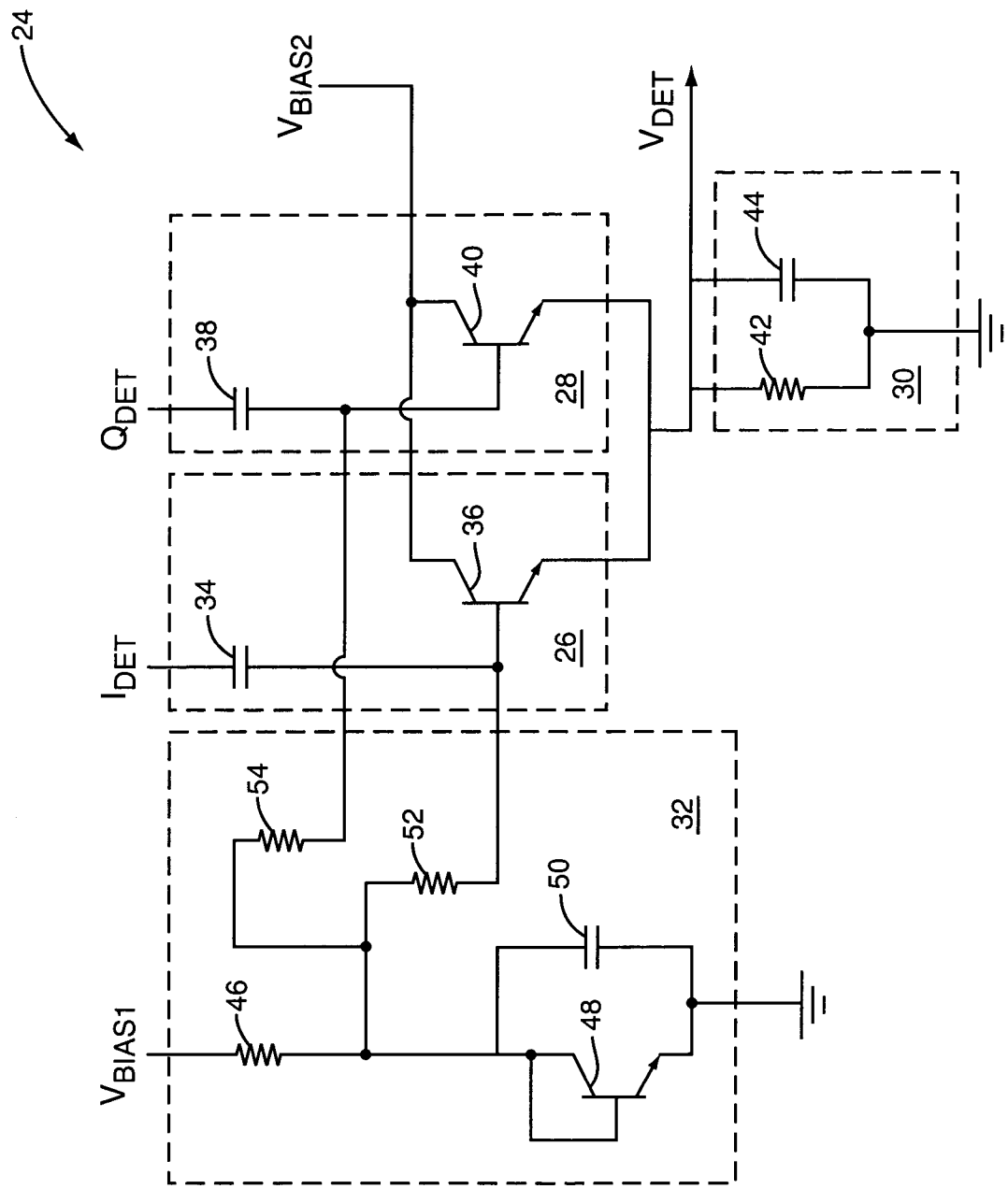
FIG. 4 shows the details of one embodiment of the quadrature RF power detector of FIG. 3.
Figure 5:
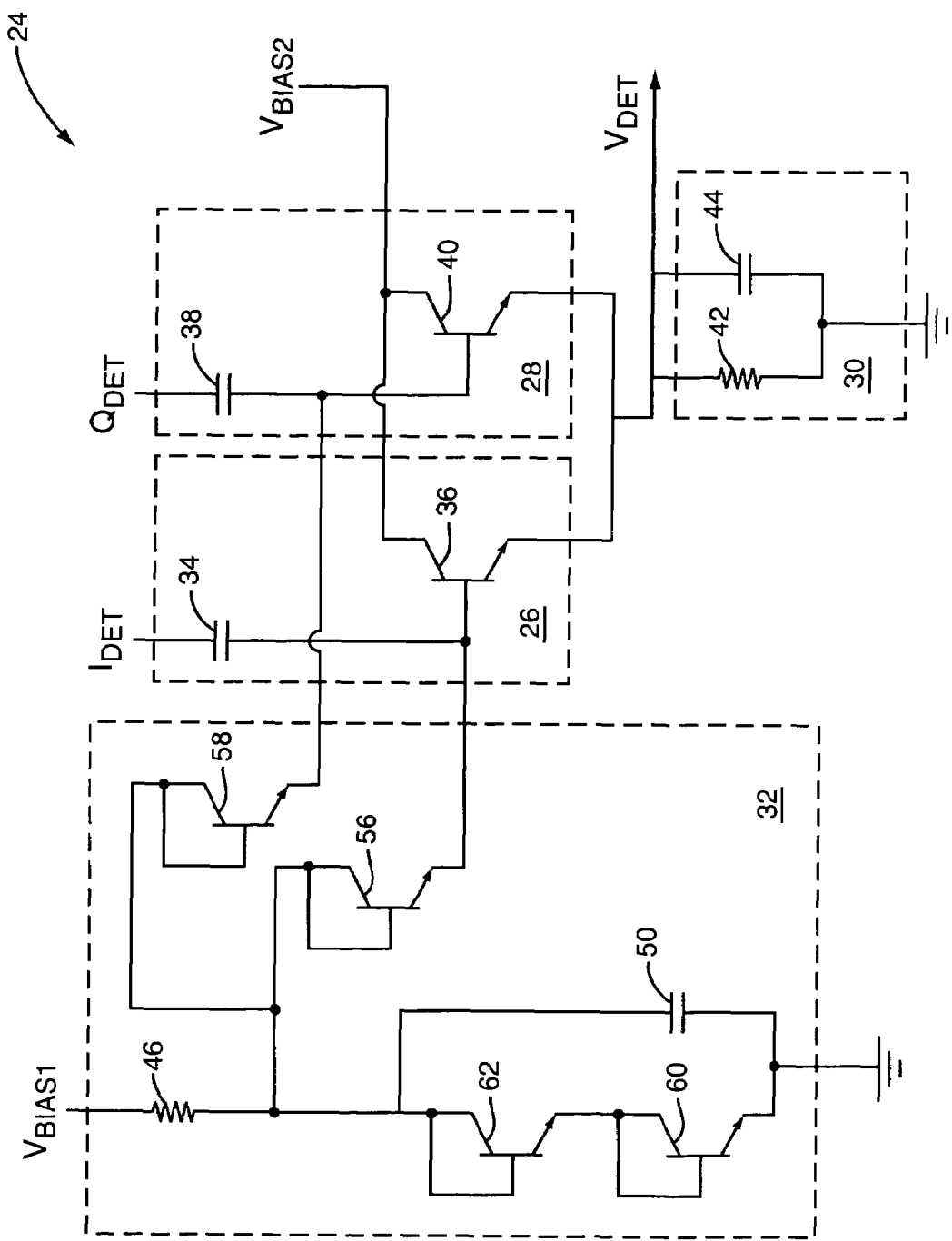

FIG. 5 adds a power doubler circuit to the quadrature RF power detector of FIG. 4.

Figure 6:
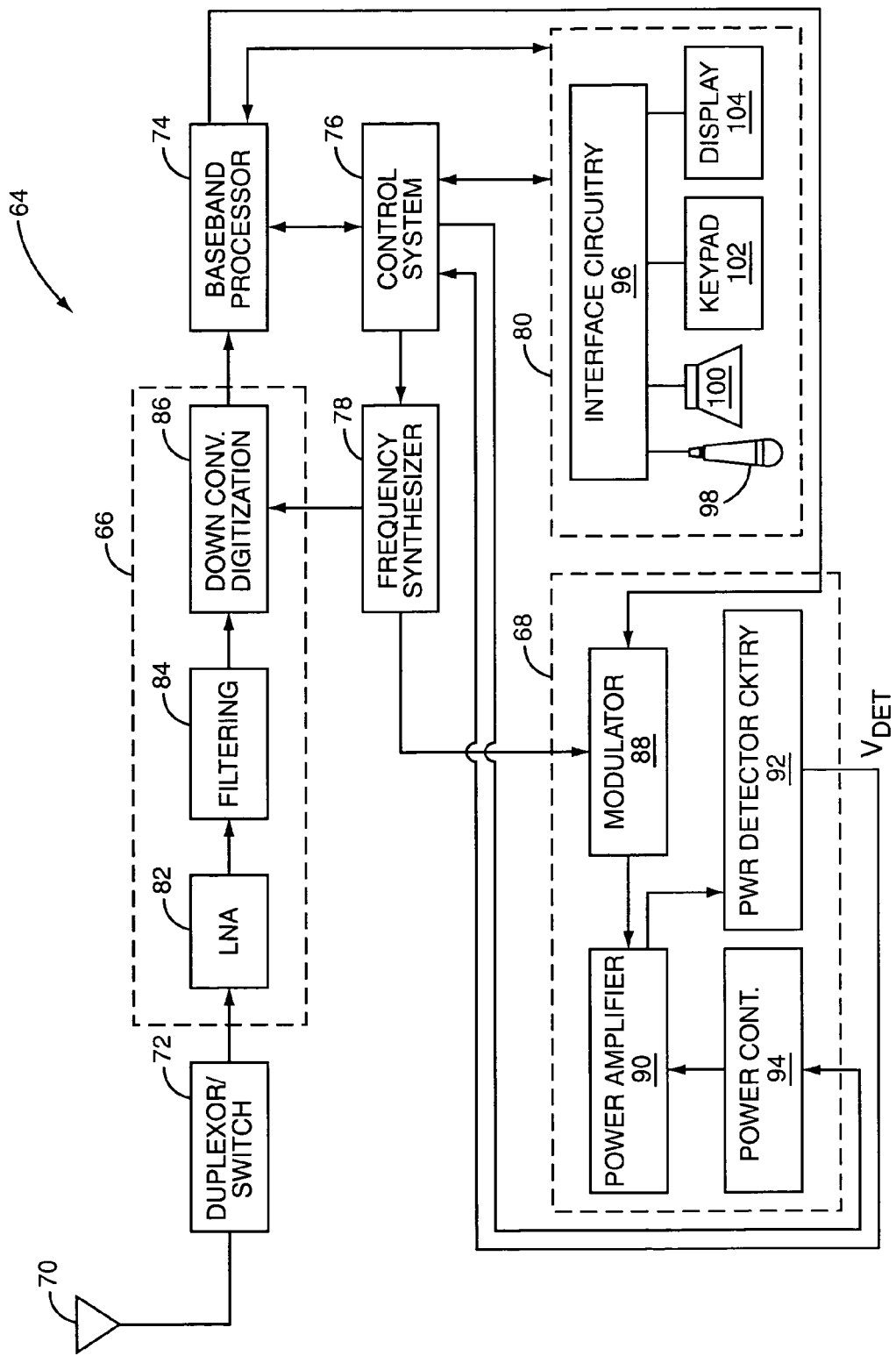

FIG. 6 shows one embodiment of the present invention used in a mobile terminal.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
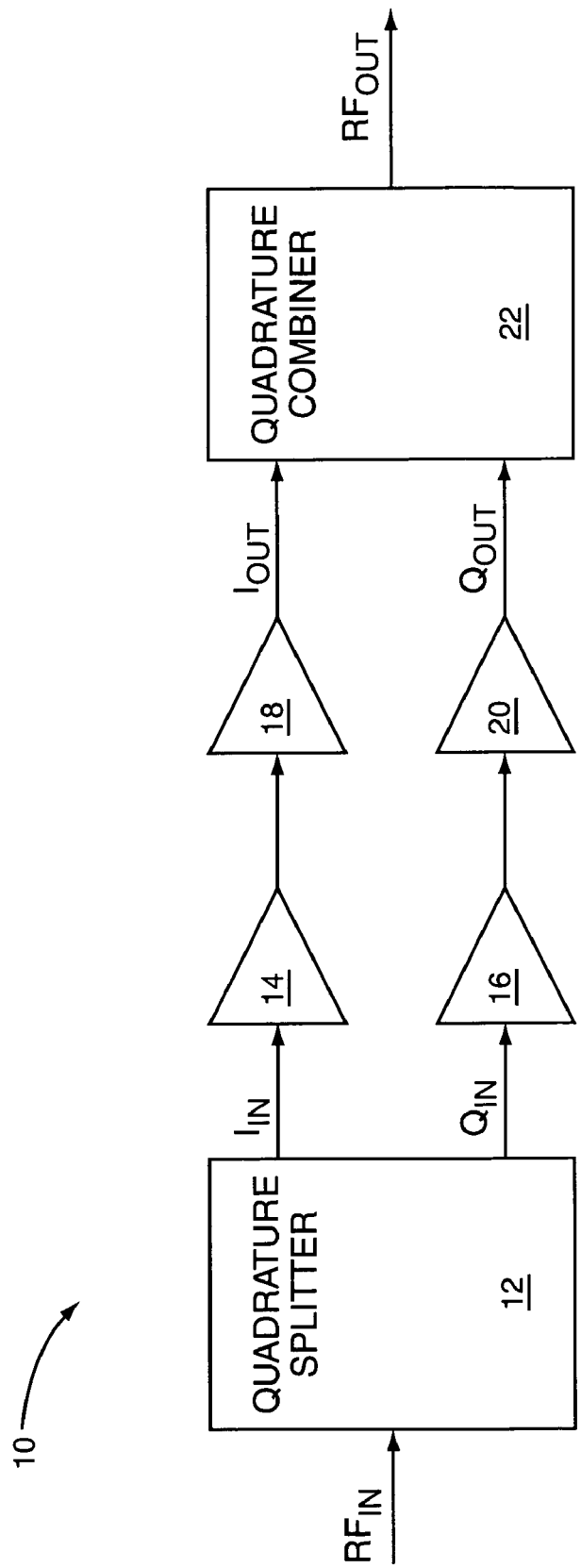
FIG. 1 shows a block diagram of a quadrature RF power amplifier.

The present invention is a quadrature RF power detector circuit used to measure the output power from a quadrature RF power amplifier 10. The basic architecture of the quadrature RF power amplifier 10 is shown in FIG. 1. An RF input signal, named $RF_{IN}$, is received by a quadrature splitter 12, which splits and phase-shifts $RF_{IN}$ into two quadrature signals, named $I_{IN}$ and $Q_{IN}$. $I_{IN}$ is an in-phase amplifier signal and feeds the input of a first in-phase amplifier stage 14. $Q_{IN}$ is a quadrature-phase amplifier signal and feeds the input of a first quadrature-phase amplifier stage 16. $Q_{IN}$ is phase-shifted from $I_{IN}$ by essentially 90 degrees. The first in-phase amplifier stage 14 feeds a final in-phase amplifier stage 18. The first quadrature-phase amplifier stage 16 feeds a final quadrature-phase amplifier stage 20. The final in-phase amplifier stage 18 provides an in-phase output signal, named $I_{OUT}$, which feeds a quadrature combiner 22. The final quadrature-phase amplifier stage 20 provides a quadrature-phase output signal, named $Q_{OUT}$, which also feeds the quadrature combiner 22. The quadrature combiner 22 phase-shifts and combines $I_{OUT}$ and $Q_{OUT}$ to provide a quadrature RF power amplifier 10 output signal, named $RF_{OUT}$. FIG. 1 illustrates a two-stage quadrature RF power amplifier 10; however, the present invention may be used with a quadrature RF power amplifier that includes any number of amplifier stages.

The present invention detects output power from quadrature RF power-amplifier stages that have separate and balanced I and Q signals. In one embodiment, the present invention is used to detect output power from the final stage of a quadrature RF power amplifier. The I and Q outputs of the final stage are used instead of a combined output from the quadrature RF power amplifier final stage. Using I and Q signals reduces the impact of RF power amplifier output load variations on the accuracy of the power measurement.

Figure 2:
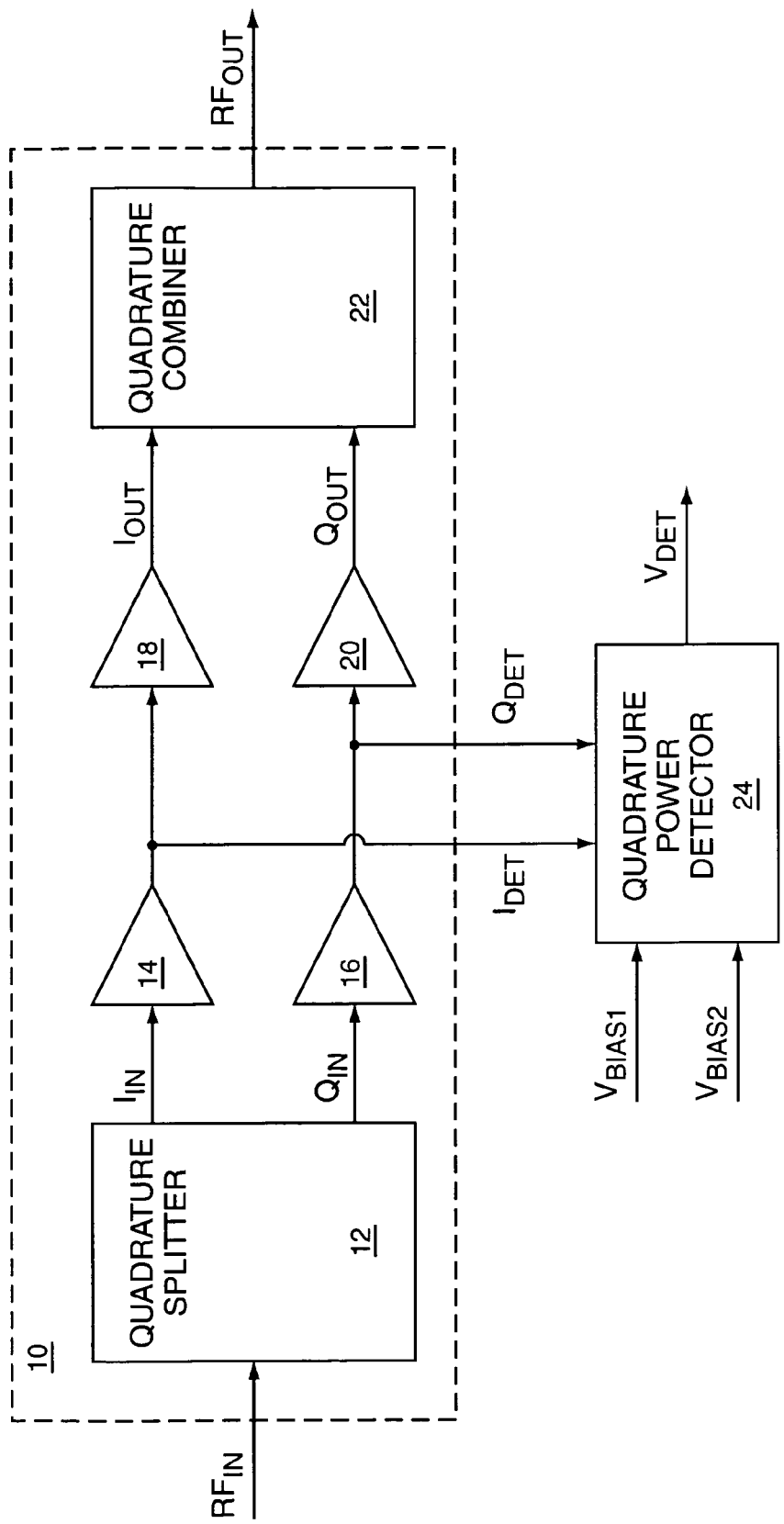
FIG. 2 shows a block diagram of the quadrature RF power amplifier of FIG. 1 using one embodiment of the present invention, which is a quadrature RF power detector.

In one embodiment of the present invention, a quadrature RF power detector 24 is coupled to the quadrature RF power amplifier 10 as shown in FIG. 2. The quadrature RF power detector 24 receives an in-phase detection signal, named $I_{DET}$, from the first in-phase amplifier stage 14 and a quadrature-phase detection signal, named $Q_{DET}$, from the first quadrature-phase amplifier stage 16. The quadrature RF power detector 24 detects and amplifies each detection signal and then combines and filters the detected, amplified detection signals to provide a quadrature RF power detector 24 output signal, named $V_{DET}$, which is indicative of the sum of the output power from the first in-phase amplifier stage 14 and the first quadrature-phase amplifier stage 16. DC supply voltages, named $V_{BIAS1}$ and $V_{BIAS2}$, provide DC power and reference voltages needed by the quadrature RF power detector 24.

Other embodiments of the present invention may be used with quadrature RF power amplifiers, which may include any number of quadrature amplifier stages such that the present invention is used to measure output power from one or more of the quadrature amplifier stages. The present invention can be implemented using any transistor technology including MOSFET technology, JFET technology, or bipolar technology.

Figure 3:
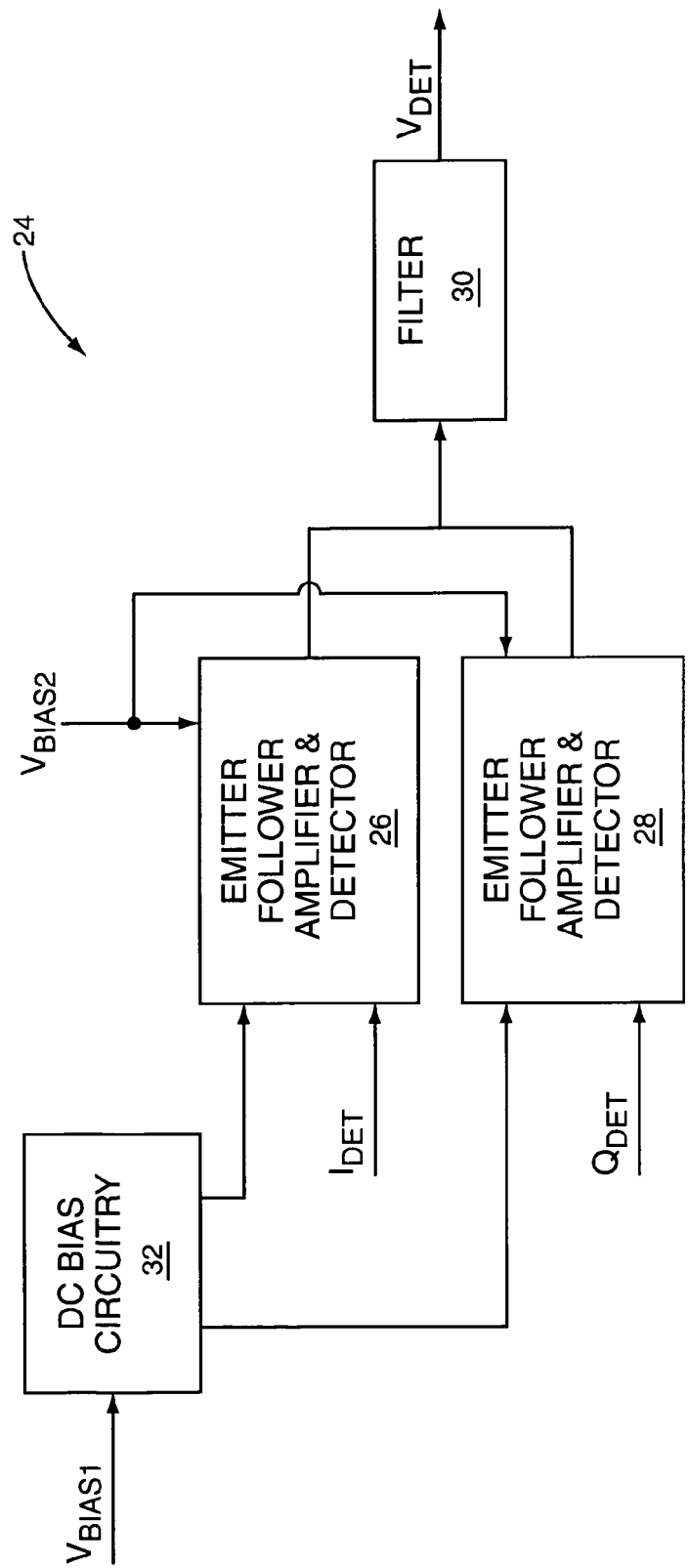
FIG. 3 is a block diagram of the quadrature RF power detector of FIG. 2.

FIG. 3 is a block diagram of the quadrature RF power detector 24 of FIG. 2. $I_{DET}$ feeds an in-phase emitter follower amplifier and detector 26. $Q_{DET}$ feeds a quadrature-phase emitter follower amplifier and detector 28. The outputs of the emitter follower and detectors 26, 28 are combined and feed an emitter follower filter 30, which removes ripple from the amplified, detected, and combined signals to provide $V_{DET}$.

DC bias circuitry 32 provides DC bias needed by the emitter follower and detectors 26, 28. In another embodiment of the present invention, the DC bias circuitry 32 includes doubler circuitry to allow detection of both half-cycles of the detection signals. $V_{BIAS1}$ provides the DC reference voltage needed by the DC bias circuitry 32. $V_{BIAS2}$ provides the DC supply voltage needed by the emitter follower and detectors 26, 28.

The emitter follower amplifiers and detectors 26, 28 provide power detection with minimal DC current and without significant RF loading at the point of detection, such as an RF interstage. This balanced detector scheme also provides more accurate power detection under high VSWR conditions due to the quadrature action minimizing peaks and valleys in the detected voltage.

FIG. 4 shows the details of one embodiment of the quadrature RF power detector 24 of FIG. 3. The in-phase emitter follower amplifier and detector 26 includes an in-phase coupling capacitor 34 and an in-phase emitter follower transistor 36. $I_{DET}$ feeds the in-phase coupling capacitor 34, which then feeds the base of the in-phase emitter follower transistor 36. The quadrature-phase emitter follower amplifier and detector 28 includes a quadrature-phase coupling capacitor 38 and a quadrature-phase emitter follower transistor 40. $Q_{DET}$ feeds the quadrature-phase coupling capacitor 38, which then feeds the base of the quadrature-phase emitter follower transistor 40. The collectors of the emitter follower transistors 36, 40 are coupled to $V_{BIAS2}$. The emitters of the emitter follower transistors 36, 40 are coupled to each other and feed the emitter follower filter 30, which includes an emitter resistor 42 and an emitter capacitor 44. The emitter resistor 42 and emitter capacitor 44 are connected in parallel to form the emitter follower filter 30; therefore, the emitter follower transistors 36, 40 are connected in an emitter follower configuration. Since the base-emitter junctions of the emitter follower transistors 36, 40 are forward biased only during positive half-cycles of the detection signals, the emitter follower and detectors 26, 28 function as power detectors. $V_{DET}$ is fed from the emitter follower filter 30.

The DC bias circuitry 32 provides DC bias needed by the bases of the emitter follower transistors 36, 40. A bias supply resistor 46 is connected to $V_{BIAS1}$ to provide bias current to a bias transistor 48, which provides an output voltage essentially equal to the base-to emitter voltage drop of the emitter follower transistors 36, 40. A bias filter capacitor 50 is coupled to the bias transistor 48 to provide a filtered bias voltage. An in-phase bias resistor 52 connects the base of the in-phase emitter follower transistor 36 to the filtered bias voltage. A quadrature-phase bias resistor 54 connects the base of the quadrature-phase emitter follower transistor 40 to the filtered bias voltage. In another embodiment of the present invention, a diode is used in place of the bias transistor 48.

Traditional passive RF power detectors have no impedance translation; however, since the emitter follower transistors 36, 40 provide current gain, the input impedance of the quadrature RF power detector 24 is higher than its output impedance; therefore, the quadrature RF power detector 24 may be used with any quadrature stage of an RF power amplifier. The low output impedance of the quadrature RF power detector 24 allows the use of low impedance loads, which may be 2000 ohms. Also, the low output impedance of the quadrature RF power detector 24 allows support of faster response times than with traditional passive RF power detectors, which is useful when controlling output power from a quadrature RF power amplifier.

In another embodiment of the present invention, a diode doubler circuit is added to the DC bias circuitry 32 as shown in FIG. 5. The in-phase bias resistor 52 (FIG. 4) is replaced with an in-phase bias transistor 56. The quadrature-phase bias resistor 54 (FIG. 4) is replaced with a quadrature-phase bias transistor 58. Since the bias transistors 56,58 add another base-to-emitter junction to the DC bias circuitry 32, the bias transistor 48 (FIG. 4) is replaced with a first bias transistor 60 in series with a second bias transistor 62. By replacing the bias resistors 52,54 (FIG. 4) with bias transistors 56,58, during negative half-cycles of the detection signals, the bias transistors 56,58 will become forward biased thereby charging the coupling capacitors 34,38 to voltages essentially equal to the amplitude of the negative half-cycles. Then, during the next positive half-cycles of the detection signals, the stored voltages from the negative half-cycles will be added to the positive half-cycles thereby essentially doubling the detected signals. In another embodiment of the present invention, diodes may be used to replace one or more of the bias transistors 56,58,60,62.

One embodiment of the present invention is implemented in a mobile terminal. The basic architecture of the mobile terminal 64 is represented in FIG. 6 and may include a receiver front end 66, a radio frequency transmitter section 68, an antenna 70, a duplexer or switch 72, a baseband processor 74, a control system 76, a frequency synthesizer 78, and an interface 80. The receiver front end 66 receives information bearing radio frequency signals from one or more remote transmitters provided by a base station. A low noise amplifier 82 amplifies the signal. A filter circuit 84 minimizes broadband interference in the received signal, while downconversion and digitization circuitry 86 downconverts the filtered, received signal to an intermediate or baseband frequency signal, which is then digitized into one or more digital streams. The receiver front end 66 typically uses one or more mixing frequencies generated by the frequency synthesizer 78. The baseband processor 74 processes the digitized received signal to extract the information or data bits conveyed in the received signal. This processing typically comprises demodulation, decoding, and error correction operations. As such, the baseband processor 74 is generally implemented in one or more digital signal processors (DSPs).

On the transmit side, the baseband processor 74 receives digitized data, which may represent voice, data, or control information, from the control system 76, which it encodes for transmission. The encoded data is output to the transmitter 68, where it is used by a modulator 88 to modulate a carrier signal that is at a desired transmit frequency. Quadrature power amplifier circuitry 90 amplifies the modulated carrier signal to a level appropriate for transmission, and delivers the amplified and modulated carrier signal to the antenna 70 through the duplexer or switch 72. The present invention is a quadrature RF power detector 92 used to measure the output power from the quadrature power amplifier circuitry 90. The quadrature RF power detector 92 provides a signal, named $V_{DET}$, indicative of the output power to the control system 76, which then adjusts transmitter power control circuitry 94 to provide the proper output power from the quadrature power amplifier circuitry 90.

A user may interact with the mobile terminal 64 via the interface 80, which may include interface circuitry 96 associated with a microphone 98, a speaker 100, a keypad 102, and a display 104. The interface circuitry 96 typically includes analog-to-digital converters, digital-to-analog converters, amplifiers, and the like. Additionally, it may include a voice encoder/decoder, in which case it may communicate directly with the baseband processor 74. The microphone 98 will typically convert audio input, such as the user's voice, into an electrical signal, which is then digitized and passed directly or indirectly to the baseband processor 74. Audio information encoded in the received signal is recovered by the baseband processor 74, and converted by the interface circuitry 96 into an analog signal suitable for driving the speaker 100. The keypad 102 and display 104 enable the user to interact with the mobile terminal 64, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A quadrature RF power detector comprising:

A first amplifier input adapted to receive a first amplifier signal from an output of an in-phase amplifier leg of RF power amplifier circuitry, and a second amplifier input adapted to receive a second amplifier signal from an output of a quadrature-phase amplifier leg of the RF power amplifier circuitry, wherein the second amplifier signal is phase-shifted from the first amplifier signal by essentially 90 degrees;

first amplifier and detection circuitry adapted to amplify and detect the first amplifier signal to provide a first detection output signal that is a DC representation of the first amplifier signal, wherein the input impedance of the first amplifier input is higher than the output impedance of the first amplifier and detection circuitry providing the first detection output signal;

second amplifier and detection circuitry adapted to amplify and detect the second amplifier signal to provide a second detection output signal that is a DC representation of the second amplifier signal, wherein the input impedance of the second amplifier input is higher than the output impedance of the second amplifier and detection circuitry providing the second detection output signal;

combining circuitry adapted to combine the first and second detection output signals to provide a combined detection output signal; and filter circuitry adapted to filter the combined detection output signal to reduce ripple to provide a filtered, combined detection output signal.

2. The quadrature RF power detector circuit of claim 1 further comprising:

a first transistor detector circuit comprising:

a first transistor detector input adapted to receive the first amplifier signal; and a first transistor detector output, wherein the first transistor detector output provides the first detection output signal;

a second transistor detector circuit comprising:

a second transistor detector input adapted to receive the second amplifier signal; and a second transistor detector output, wherein the second transistor detector output provides the second detection output signal, and the first transistor detector output is coupled to the second transistor detector output to provide a combined detection output, which provides the combined detection output signal; and a detector filter circuit comprising:

a detector filter circuit input coupled to the combined detection output to receive the combined detection output signal; and a detector filter circuit output, wherein the detector filter circuit output provides the filtered, combined detection output signal.

3. The quadrature RF power detector circuit of claim 2 wherein:
the first transistor detector circuit further comprises:
a first bipolar transistor element comprising a first base, a first emitter, and a first collector, wherein the first emitter is coupled to the first transistor detector output;
a first capacitive element coupled between the first transistor detector input and the first base; and
a first bias input coupled to the first base; and
the second transistor detector circuit further comprises:
a second bipolar transistor element comprising a second base, a second emitter, and a second collector, wherein the second emitter is coupled to the second transistor detector output;
a second capacitive element coupled between the second transistor detector input and the second base; and
a second bias input coupled to the second base.

4. The quadrature RF power detector circuit of claim 3 further comprising a bias circuit comprising:
a third bipolar transistor element comprising a third base, a third emitter, and a third collector, wherein the third collector is coupled to the third base;
a first resistive element coupled between the third collector and the first bias input; and
a second resistive element coupled between the third collector and the second bias input.

5. The quadrature RF power detector circuit of claim 3 further comprising a bias circuit comprising:
a third bipolar transistor element comprising a third base, a third emitter, and a third collector, wherein the third collector is coupled to the third base;
a first resistive element coupled between the third emitter and the first bias input; and
a second resistive element coupled between the third emitter and the second bias input.

6. The quadrature RF power detector circuit of claim 3 further comprising a bias circuit comprising:
a first diode element comprising a first cathode and a first anode;
a first resistive element coupled between the first cathode and the first bias input; and
a second resistive element coupled between the first cathode and the second bias input.

7. The quadrature RF power detector circuit of claim 3 further comprising a bias circuit comprising:
a first diode element comprising a first cathode and a first anode;
a first resistive element coupled between the first anode and the first bias input; and
a second resistive element coupled between the first anode and the second bias input.

8. The quadrature RF power detector circuit of claim 3 further comprising a bias circuit comprising:
a third bipolar transistor element comprising a third base, a third emitter, and a third collector, wherein the third collector is coupled to the third base and the third emitter is coupled to the first bias input; and
a fourth bipolar transistor element comprising a fourth base, a fourth emitter, and a fourth collector, wherein the fourth collector is coupled to the fourth base and the fourth emitter is coupled to the second bias input.

9. The quadrature RF power detector circuit of claim 8 wherein the bias circuit further comprises:
a fifth bipolar transistor element comprising a fifth base, a fifth emitter, and a fifth collector, wherein the fifth collector is coupled to the fifth base; and
a sixth bipolar transistor element comprising a sixth base, a sixth emitter, and a sixth collector, wherein the sixth collector is coupled to the sixth base, the sixth emitter is coupled to the fifth collector, the sixth collector is coupled to the third collector, and the sixth collector is coupled to the fourth collector.

10. The quadrature RF power detector circuit of claim 9 wherein the bias circuit further comprises a capacitive element coupled between the fifth emitter and the sixth collector.

11. The quadrature RF power detector circuit of claim 3 further comprising a bias circuit comprising:
a third bipolar transistor element comprising a third base, a third emitter, and a third collector, wherein the third collector is coupled to the third base and the third collector is coupled to the first bias input; and
a fourth bipolar transistor element comprising a fourth base, a fourth emitter, and a fourth collector, wherein the fourth collector is coupled to the fourth base and the fourth collector is coupled to the second bias input.

12. The quadrature RF power detector circuit of claim 11 wherein the bias circuit further comprises:
a fifth bipolar transistor element comprising a fifth base, a fifth emitter, and a fifth collector, wherein the fifth collector is coupled to the fifth base; and
a sixth bipolar transistor element comprising a sixth base, a sixth emitter, and a sixth collector, wherein the sixth collector is coupled to the sixth base, the sixth collector is coupled to the fifth emitter, the sixth emitter is coupled to the third emitter, and the sixth emitter is coupled to the fourth emitter.

13. The quadrature RF power detector circuit of claim 12 wherein the bias circuit further comprises a capacitive element coupled between the fifth collector and the sixth emitter.

14. The quadrature RF power detector circuit of claim 3 further comprising a bias circuit comprising:
a first diode element comprising a first cathode and a first anode, wherein the first cathode is coupled to the first bias input; and
a second diode element comprising a second cathode and a second anode, wherein the second cathode is coupled to the second bias input.

15. The quadrature RF power detector circuit of claim 14 wherein the bias circuit further comprises:
a third diode element comprising a third cathode and a third anode; and
a fourth diode element comprising a fourth cathode and a fourth anode, wherein the fourth cathode is coupled to the third anode, the fourth anode is coupled to the first anode and the fourth anode is coupled to the second anode.

16. The quadrature RF power detector circuit of claim 15 wherein the bias circuit further comprises a capacitive element coupled between the third cathode and the fourth anode.

17. The quadrature RF power detector circuit of claim 3 further comprising a bias circuit comprising:
a first diode element comprising a first cathode and a first anode, wherein the first anode is coupled to the first bias input; and
a second diode element comprising a second cathode and a second anode, wherein the second anode is coupled to the second bias input.

18. The quadrature RF power detector circuit of claim 17 wherein the bias circuit further comprises:
a third diode element comprising a third cathode and a third anode; and
a fourth diode element comprising a fourth cathode and a fourth anode, wherein the fourth anode is coupled to the third cathode, the fourth cathode is coupled to the first cathode and the fourth cathode is coupled to the second cathode.

19. The quadrature RF power detector circuit of claim 18 wherein the bias circuit further comprises a capacitive element coupled between the third anode and the fourth cathode.

20. The quadrature RF power detector circuit of claim 2 wherein the detector filter circuit further comprises:

the detector filter circuit input coupled to the detector filter circuit output;
a capacitive element coupled between the detector filter circuit input and ground; and
a resistive element coupled between the detector filter circuit input and ground.

* * * * *